United States Patent [19]

Smialek

[11] 3,969,065

[45] July 13, 1976

[54] SWITCHING DEVICES FOR PHOTOFLASH UNIT

[75] Inventor: Robert L. Smialek, Pepper Pike, Ohio

[73] Assignee: General Electric Company, Schenectady, N.Y.

[22] Filed: Nov. 4, 1974

[21] Appl. No.: 520,968

[52] U.S. Cl. ............................ 431/95 A; 240/1.3; 337/413; 252/518
[51] Int. Cl.² ........................................ F21K 5/02
[58] Field of Search .......................... 431/93–95, 431/95 A; 240/1.3; 337/401, 413, 416; 252/512, 518

[56] References Cited
UNITED STATES PATENTS

| | | | |
|---|---|---|---|
| 3,297,846 | 1/1967 | Peltier | 337/416 |
| 3,451,813 | 6/1969 | Kinney et al. | 96/36.2 |
| 3,458,270 | 7/1969 | Ganser et al. | 431/95 |
| 3,608,451 | 9/1971 | Kelem | 240/1.3 |
| 3,614,412 | 10/1971 | Bellows | 240/1.3 |
| 3,619,590 | 11/1971 | Meulemans et al. | 240/1.3 |
| 3,867,315 | 2/1975 | Tigner et al. | 252/518 |

*Primary Examiner*—Carroll B. Dority, Jr.
*Attorney, Agent, or Firm*—John F. McDevitt; Lawrence R. Kempton; Frank L. Neuhauser

[57] ABSTRACT

A multiple flashlamp array having a plurality of lamps fired individually and in sequence which includes a plurality of static solid switching devices capable of being easily activated by radiant energy generated during flashing of the lamps. Initially, the switches have a high resistance ("off position") and after being activated by radiation, they undergo chemical conversion to a conductive state ("on position"). The switches are prepared from compositions which impart improved shelf life under conditions of relatively high humidity at above normal ambient temperatures. The switch material composition comprises a mixture of a solid copper salt with a humidity resistant organic polymer binder and a finely divided metal reducing agent.

3 Claims, 4 Drawing Figures

U.S. Patent   July 13, 1976   3,969,065
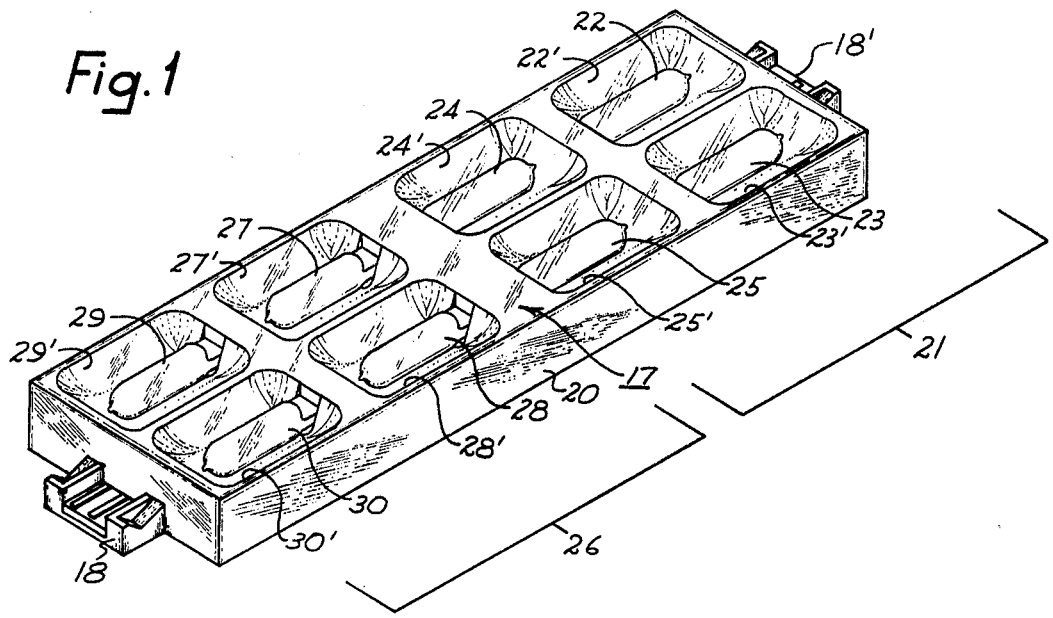
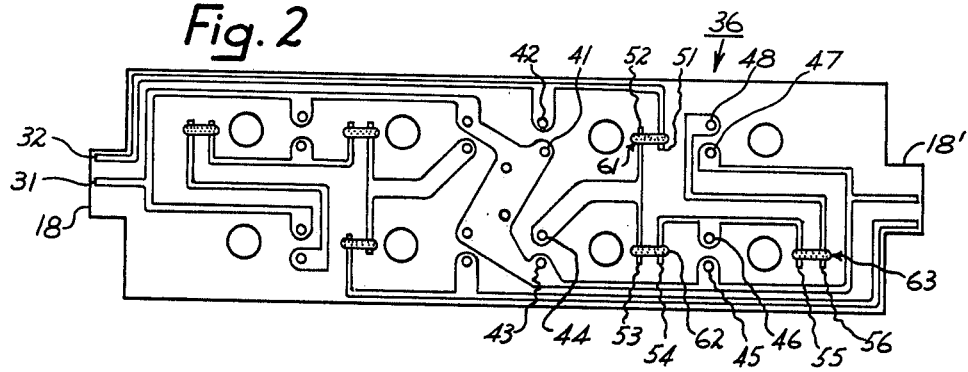
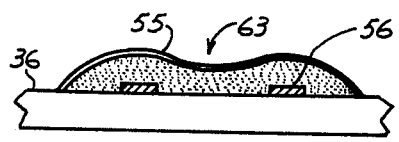
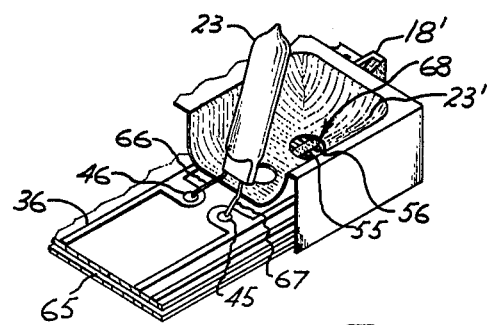

SWITCHING DEVICES FOR PHOTOFLASH UNIT

CROSS-REFERENCE TO RELATED APPLICATION

A multiple flashlamp array having associated electrical circuit means for sequential firing of the individual flashlamps and employing static solid switches wherein finely divided cupric oxide is converted to elemental copper is described and claimed in a U.S. patent application entitled "Switching Devices for Photoflash Unit", Ser. No. 520,967, filed concurrently herewith in the names of M. S. Jaffe and R. L. Smialek, and assigned to the assignee of the present invention.

BACKGROUND OF THE INVENTION

The present invention is in the field of multiple photoflash lamp arrays, such as flashcubes and planar arrays, adapted to be temporarily attached to a camera capable of producing a plurality of flashes for taking a plurality of pictures. In general, these multiple photoflash arrays or assemblies comprise a reflector unit having a plurality of adjacent reflector cavities, each having a photoflash lamp mounted therein and are well known in the art.

The conventional flashcube is one well-known embodiment of such photoflash lamp arrays and an example of a flashcube is described in the U.S. Pat. No. 3,739,166 to R. M. Anderson. Various type linear or planar photoflash arrays are also well-known in the art wherein a series of reflectors are arranged in one or more rows which may face in the same direction to form a single-sided array or in opposite direction to form a two-sided array. An example of such two-sided array is described in the U.S. Pat. No. 3,598,984 whereas such single-sided array is described in the U.S. patent application entitled "Multiple Photoflash Lamp Unit", of K. H. Weber, Ser. No. 448,671, filed Oct. 22, 1973, now Pat. No. 3,937,946 and assigned to the assignee of the present invention.

As further illustrative of the various designs and constructions that have already been proposed for multiple lamp photoflash arrays, it is known to have associated flashlamp-reflector assemblies mounted adjacent to one another in one or more rows facing in the same direction and operatively associated with electrical circuit means so that a group of the flashlamps which are relatively further from the camera lens axis than are the other lamps of the unit will be flashed. This mode of operation can be accomplished with a lamp configuration in which the individual flashlamps are electrically connected to a printed circuitboard member with electrical contact being made to the camera by contact tabs located at the opposite ends of the circuitboard which readily plug into a suitable receiving socket on the camera itself or to an adaptor thereto. An electrical energy source which may be contained within the camera is connected to said contact tabs so that a firing pulse produced by the source can be applied across said contacts depending upon the type of lamps used in the flashlamp array. If low voltage filament type flashlamps are employed in the array, the firing pulse source may be of the battery or battery-capacitor discharge type producing in synchronization with opening of the camera shutter, a pulse of approximately 3 volts to 15 volts or more and of sufficient energy to fire a single flashlamp. An example of suitable low voltage flashlamp is disclosed in U.S. Pat. No. 3,506,385 to K. H. Weber and G. W. Cressman and an example of a low-voltage flash-sequencing circuit is disclosed in the U.S. Pat. No. 3,532,931 to P. T. Cote' and J. D. Harnden. If the flashlamps in the multiple flash array are of the so-called high-voltage type, requiring a pulse of approximately 1,000–2,000 volts, the firing pulse source may comprise a suitable battery-capacitor discharge and voltage step-up transformer type circuit, or may employ a compact piezoelectric element arranged to be impacted or stressed in synchronization with opening of the camera shutter, so as to produce a firing pulse having a voltage of approximately 1,000 or 2,000 volts and of sufficient energy to fire a single flashlamp. An example of a high-voltage flashlamp and a firing pulse source comprising a piezoelectric element synchronized with the camera shutter described in U.S. Pat. Nos. 2,972,937 and 3,106,080, both to C. G. Suits.

Radiation switches which are suitable in a flash sequencing circuit of the type above generally described are also known. The switches which can be employed in various ways are converted from a high resistance or open circuit condition upon flashing of an adjacent flashlamp in the array to provide a low resistance circuit path to another unflashed lamp. An already known solid switch material composition which provides greater humidity resistance at above normal ambient temperatures and operates in this manner is described and claimed in U.S. patent application, Ser. No. 508,105, filed Sept. 23, 1974 and now abandoned, entitled "Switching Devices for Photoflash Unit", in the names of R. L. Smialek and M. S. Jaffe, and assigned to the assignee of the present invention. The particular switch material composition described in said patent application comprises a mixture containing a silver source and a humidity resistant organic polymer binder which further contains a small but effective amount of a stabilizer additive forming an insoluble reaction product with silver ion.

A technique is also described in U.S. Pat. No. 3,451,813 to L. C. Kinney et al. for producing a printed circuit by forming a pattern of a photoflash sensitive conducting metal precursor such as silver oxide, copper oxide, nickel formate, or copper powder on a substrate and photoflashing high intensity radiation for a short duration such as 0.2 to 30 milliseconds onto the pattern to convert it to a coherent conducting metal circuit adherent to the substrate. Since the source material which can be converted to an electrically conductive state in this manner is said to include metals and metal compounds which are already electrically conductive, it is apparent that such mixtures which further can contain an organic polymer binder would not prove suitable as a static solid switching device in a flashlamp sequencing circuit. Said technique can further require multiple photoflashes to provide electrical conductivity when a copper source material is converted to a metallic copper deposit which would not be suitable in a flashlamp sequencing circuit operating in the manner above generally described. Still other electrically conductive reducing agents and fluxing agents are recommended as additives to the already electrically conducting and semi-conducting metal precursor materials being utilized and in amounts which could render such material compositions entirely inoperative in switching from a high resistance to a low resistance only when activated by actinic radiation.

In the aforementioned concurrently filed U.S. patent application Ser. No. 520,967, there is disclosed a switch material composition which is suitable in a flash sequencing circuit of the type above generally described which comprises a mixture of finely divided cupric oxide with a humidity resistant organic polymer binder. Useful cupric oxide material is maintained below an average particle size of 1 micron to provide the desired flashing sensitivity of operation with existing flashlamp constructions. The desired conversion of cupric oxide to elemental copper takes place with accompanying combustion of the organic binder in the preferred switch material compositions by further maintaining stoichiometric proportions between cupric oxide and the binder in the mixture. The switches have also been found to exhibit improved shelf life under conditions of relatively high humidity at above normal ambient temperatures.

SUMMARY OF THE INVENTION

It has now been discovered that a particular class of solid copper salts provides a material which can be converted by actinic radiation to a conductive state in the above type solid switching device and without requiring stabilizing additives in the material composition to provide greater humidity resistance at above normal ambient temperatures. Useful copper salts are salts of organic acids which can be thermally decomposed in the presence of a finely divided non-conductive metal reducing agent at temperatures up to about 250°C. The preferred copper salts have an organic radical derived from short chain saturated and unsaturated aliphatic organic acids, including copper formate, copper acetate, copper formate, copper oxalate and other. Powdered metal reducing agents which enhance the desired conversion of these copper salts to elemental copper can be selected from the Group IV A metals including titanium, hafnium, and zirconium. It is further expected that Group V A metals such as vanadium, niobium and tantalum would also provide useful metal reducing agents in chemically reacting with the organic radical of the copper salt to form stable oxides based upon the favorable thermodynamic considerations involved.

The solid switch can be prepared in conventional fashion from a physical admixture of the powdered copper salt and reducing agent with a humidity resistant organic polymer binder which has been deposited between a pair of spaced apart electrical leads on the circuitboard member from a liquid suspension which is thereafter cured or dried to a solid material. The proportions of copper salt and reducing agent in the solid switch material composition is selected to provide optimum flashing sensitivity without a likelihood of switch failure due to overly vigorous conversion of the copper salt which could lead to an open circuit condition. More particularly, the conversion reaction can be highly exothermic if stoichiometric amounts of the metal reducing agent is present in the material composition so that the proportion of metal reducing agent is desirably limited therein from a minor proportion sufficient to increase flashing sensitivity of the switches up to approximately one-third of the stoichiometric proportion for complete reaction with the organic radical of the copper salt. Furthermore, if the amount of metal reducing agent is not limited to approximately one-third of the stoichiometric amount, it is possible for the unconverted switch to be excessively conductive. In a preferred switch material composition this upper limit upon the content of the reducing agent can be exemplified with 0.2 gram titanium metal per gram of copper formate in the composition. Preferred switch material compositions contain from about 70–95 weight percent of the copper salt in the mixture, the remainder being metal reducing agent plus sufficient binder for adherence.

Useful binder materials for the present radiation switch devices can be selected from the class of humidity resistant organic polymers which can be employed in the form of a liquid medium for suspension and dispersion of the particulate solids in the switch material composition. The amount of organic polymer binder is preferably about 5–30 weight percent based on the copper salt in the switch composition. Useful binders include the cellulose esters such as cellulose nitrate and cellulose acetate butyrate; the cellulose ethers such as ethyl cellulose and ethyl hydroxyethyl cellulose; acrylates such as polymethyl methacrylate, polymethyl acrylate; polycarbonates; and polystyrene as well as styrene copolymers such as a thermoplastic block copolymer of styrene with butadiene.

Useful solvents to provide a liquid paste consistency for deposition of the individual switches by conventional printing techniques include pine oil, hydrocarbon fluids, esters, for example, an ether-ester, etc., such as admixtures of hydrocarbons with alcohols. The liquid paste can be formed by mixing the copper salt and reducing agent with the organic binder and solvent to form a uniform dispersion. In depositing the switches for a preferred circuitboard embodiment of the present invention wherein each switch is located between a pair of spaced apart electrical terminals on the circuitboard, the paste is applied as a thin layer and the solvent thereafter evaporated to provide the solid switching elements.

BRIEF DESCRIPTION OF THE DRAWINGS

FIG. 1 is a perspective view of a multiple photoflash array according to the present invention;

FIG. 2 is a top view of the circuitboard showing a series circuit arrangement of the associated electrical circuitry for a multiple photoflash array as illustrated in FIG. 1 which includes the deposited switching devices;

FIG. 3 is a three-dimensional broken-away view showing a single flashlamp in a slightly raised position and also showing the relationship between said lamp and the adjacent switch; and FIG. 4 is a cross-sectional view through a single switch and the connecting terminals as shown in FIG. 3.

DESCRIPTION OF THE PREFERRED EMBODIMENTS

Referring now to the accompanying drawings, in the preferred embodiment illustrated in FIG. 1, a multiple flashlamp unit 17 shown as being of the planar array type and containing a plurality of electrically fired flashlamps is provided with a plug-in connected tab 18 at the lower side or end thereof adapted to fit directly into a camera. The lamp array 17 is also provided with a second plug-in connector tab 18' at the top side or opposite end thereof whereby the array 17 is adapted to be attached to the camera in either of two orientations, i.e., with either the tab 18 or 18' being plugged into the camera. Upon connecting this multiple flash array to a camera in these different orientations, it becomes possible to flash a group of lamps which is relatively further from the camera lens axis than are the other lamps of the array. More particularly, the first and second connected tab means for connecting the electrical circuit to a camera provides that only a first group of flashlamps can be flashed when the first connector means is connected to the camera and that only a second group of flashlamps can be flashed when the second connector means is connected to the camera. A camera containing flash activation means (not shown) alternatively couples to the pair of electrical terminals providing the connector means of this particular circuitboard configuration whereupon electrical conductors in the circuit path enable the appropriate lamps to be flashed as hereinafter explained in greater detail.

The array 17 is provided with an upper group 21 of flashlamps 22, 23, 24, and 25 and a lower group 26 flashlamps 27, 28, 29, and 30. Reflectors 22'–25' and 27'–30' are disposed behind the respective flashlamps so that as each lamp is flashed, its light is projected forwardly of the array 17. As can be seen from the drawing, the reflector unit has a plurality of outwardly facing reflectors in linear rows arranged in side-by-side relationship and facing outwardly in the same direction. The individual flashlamps are mounted within the innermost part of an associated reflector with the relationship of each reflector to its associated lamp and the arrangement of a suitable plastic housing 20 providing cover means for said array may be generally that as disclosed in the above reference patents and patent applications. As will be seen more clearly in connection with the detailed description of the circuitboard member in FIG. 2, the four lamps in the upper group 21 are connected to the lower plug-in tab 18, and the lower group 26 of lamps are connected to the upper plug-in tab 18'. It becomes thereby possible with such associated sequencing circuitry to flash the group of lamps relatively farthest from the lens axis of the camera.

FIG. 2 shows a circuitboard 36 which is contained within the housing 20 and with said housing having the form of a base to which light-transmitting cover means is secured thereto to hold the entire assembly together. The circuitboard member is contained within the housing behind the reflectors 22', etc., and provides support means for the flashlamps which are secured to the board by their lead-in wires (see FIG. 3) to provide the electrical circuitry for sequential firing of each group of lamps. The plug-in connector tabs 18 and 18' may be formed integrally with the circuitboard 36 on the opposite ends thereof as shown. While an entire illustrative printed circuit is shown, only the portion of the printed circuit servicing the upper group 21 will be discussed in detail since the portion of the printed circuit servicing the lower group 26 as depicted is essentially the reverse mirror image thereof. The circuitboard 36 is considered from the point in view of being plugged into the camera (not shown) through the connector tab 18 whereby the circuitboard terminals 31 and 32 make electrical contact with the flash activation means of the camera. The circuitboard terminal 31 is part of a continuous conductor run on the board which is connected to one electrical lead wire of all the flashlamps and for purposes of this description to the four flashlamps 22, 23, 24, and 25 at points 41, 43, 45, and 47 by suitable means such as soldering, welding, or crimping. The second terminal 32 is part of a conductor run that is connected to the second lead wire of lamp 24 at point 42 and terminates at radiation switch terminal 51 which is close to, but spaced apart from, radiation switch terminal 52. Similar switch terminal pairs are located at 53–54 and 55–56. The second lead wires of lamps 25, 23, and 22 are attached to points 44, 46, and 48, respectively. Radiation switches 61, 62, and 63 respectively, are positioned to be in contact with and bridge across the respective pair of switch terminals at 51–52, 53–54, and 55–56. Initially, all the switches are in the " off" position which permits only the first bulb 24 in the sequence to be fired. The firing of any flashbulb turns the switch adjacent thereto to the "on" position. Operated with lamps which become open-circuited upon flashing, the described circuit embodiment employs this static type switch means to sequence the next unflashed lamp in the group by means of a parallel connection of the lamps with the switch devices being connected in series with one another. The same result could be produced with the same type flashlamps being connected in parallel with respect to one another by having each switch device connected in series with a single lamp between the branch circuits of the flashlamps.

FIG. 3 illustrates a single flashlamp 23 in a slightly raised position with the transparent cover means removed to show the relative position between the lamp 23 and the switch 63 adjacent thereto below reflector 23'. The flashlamp 23 is attached to and supported by the printed circuitboard 36 through leads 66 and 67 at points 45 and 46, respectively. The switch 63 previously described in connection with FIG. 2 bridges switch terminal pair 55 and 56 and an opening 68 is provided in the reflector 23' between the bulb 23 and the switch 63 to facilitate radiation transfer.

When lamp 23 is disposed in its usual position shown in FIG. 1, a portion of the envelope of the lamp is located about 2 millimeters from the switch. As the lamp 23 is flashed, light and heat radiation is transmitted to the switch 63 and turns the switch from the off position to the on by initiating a thermal chemical reaction.

FIG. 4 shows an enlarged cross-section of the switch configuration in FIG. 3 wherein a mass of the switch material interconnects a pair of spaced-apart electrical leads. In this embodiment, the switch terminal pair 55 and 56 are mounted on the circuitboard 36. The radiation switch 63 is applied to the circuitboard 36 as a coating in electrical contact with the electrode terminals 55 and 56. Each of the radiation switches 61, 62, and 63 upon receiving heat and/or light radiation from the adjacent lamp when it is flashed, changes from an open circuit of high resistance to a closed circuit of low resistance thereby electrically connecting the switch terminals embedded therein.

In its preferred embodiments, the present switch material composition is formulated to provide the desired sensitivity of operation with existing flashlamp constructions. Accordingly, the desired conversion of the copper salt to elemental copper takes place with accompanying oxidation of the metal reducing agent wherein at least part of the oxygen required for such oxidation is obtained by chemical reduction of the copper salt. A complete reduction of the copper salt in this manner can be promoted if stoichiometric principles are applied for the proportions of copper salt and reducing agent in the mixture. As an example of these principles, it can be seen that each copper salt molecule can furnish up to four oxygen atoms for combustion of the metal which requires 2 or 2½ oxygen atoms for each metal atom (depending upon which metal oxide product is formed). The above defined stoichiometric ratio can still be followed even though the polymer binder in the composition may combine by a different chemical reaction with some of the available oxygen atoms in the copper salt for its substantially complete conversion to elemental copper; the group IV A and V A metals are much more powerful reducing agents and would certainly dominate the overall reaction.

The following example of a preferred switch material composition in accordance with the above considerations is now given to provide further detailed illustration of the present invention.

EXAMPLE

A liquid paste was prepared with 5 grams copper formate, 0.5 grams powdered titanium, and 1 gram polystyrene binder. The mixture was prepared by dissolving the polystyrene binder constituent in mixed organic solvents and dispersing the copper formate and titanium powder therein. The liquid paste was subsequently stencilled onto polystyrene circuitboards already having printed silver conductors thereon. Eight individual switching elements were deposited on each board for electrical testing with each switch having the configuration of an approximately ⅜ inch diameter disk of 78 microns average thickness. The switching elements were then dried in conventional fashion and exhibited an electrical resistance value of greater than $10^8$ ohms prior to further testing of shelf life and stability to environmental conditions. The applicable environmental tests for commercial use requires the switch elements to remain operative after being exposed to conditions of 96% relative humidity at a temperature of 120°F for 14 days. In this procedure, a suitable glass chamber partially filled with water is heated to a temperature of 120°F and a test circuitboard is placed in a chamber above the water level. The switches are thereby exposed to moisture at 96% relative humidity but without condensing water on the surface of the switches. During this test, the chamber is open at intervals and the board is removed to have the electrical resistance of the switches measured in various ways. An object of such electrical testing is to be sure that the electrical resistance does not fall below $10^8$ ohms when a 30-volt DC voltage is impressed across the individual switches with the further object being an ability to convert each switch to less than 5 ohms electrical resistance by flashing of an adjacent lamp after the switches have been exposed to the aforementioned humidity conditions. When tested in this manner, it was found that all switches demonstrated an electrical resistance greater than $10^8$ ohms after the 14-day humidity exposure. Additionally, all switches converted to an average less than 5 ohms electrical resistance following the humidity exposure when the switch elements were subsequently flashed which demonstrated adequate flashing sensitivity.

It will be apparent from the foregoing description that various modifications may be made in the above representative preferred embodiments without departing from the true spirit and scope of the invention. For example, it is not essential that the switch element be deposited directly on a printed circuitboard or operated only in conjunction with a planar flashlamp array which can illuminate only in a single direction. It is intended to limit the present invention, therefore, only by the scope of the following claims.

What I claim as new and desire to secure by Letters Patent of the United States is:

1. A multilamp photoflash unit comprising:
    a. a pair of flashlamps,
    b. an electrical circuit into which said lamps are arranged to fire individually and in sequence, and
    c. a solid state radiation switch located external of the lamps and forming part of said electrical circuit, said switch being located adjacent one of said flashlamps to receive radiant energy emitted by that flashlamp, said photoflash unit being characterized by said switch being a high relative humidity resistant mass of a material comprising a mixture of a solid copper salt of an organic acid, a humidity resistant organic polymer binder selected from the group consisting of cellulose esters, cellulose ethers, polyalkylacrylates, polyalkylmethacrylates, polystyrene, styrene copolymers, and polycarbonate, and which further contains a finely divided metal reducing agent.

2. A photoflash array as in claim 1 wherein the metal reducing agent is present from a minor proportion sufficient to increase flashing sensitivity of the switches up to approximately one-third of the stoichiometric proportion for complete reaction with the organic radical of the copper salt.

3. A radiation switch as in claim 1 wherein the switch material contains about 70–95 weight percent of the copper salt.

* * * * *